(12) United States Patent
Yagitani (10) Patent No.: US 9,063,180 B2
(45) Date of Patent: Jun. 23, 2015

(54) ELECTROMAGNETIC FIELD SPACE DISTRIBUTION VISUALIZING DEVICE, ELECTROMAGNETIC FIELD SPACE DISTRIBUTION VISUALIZING METHOD, AND PROGRAM THEREOF

(75) Inventor: Satoshi Yagitani, Kanazawa (JP)

(73) Assignee: KANAZAWA UNIVERSITY, Ishikawa (JP)

( * ) Notice: Subject to any disclaimer, the term of this patent is extended or adjusted under 35 U.S.C. 154(b) by 749 days.

(21) Appl. No.: 12/675,040

(22) PCT Filed: Aug. 28, 2008

(86) PCT No.: PCT/JP2008/002335
§ 371 (c)(1),
(2), (4) Date: Feb. 24, 2010

(87) PCT Pub. No.: WO2009/028186
PCT Pub. Date: Mar. 5, 2009

(65) Prior Publication Data
US 2011/0273559 A1 Nov. 10, 2011

(30) Foreign Application Priority Data

Aug. 29, 2007 (JP) ................................. 2007-223275

(51) Int. Cl.
*H04N 7/18* (2006.01)
*G01R 29/08* (2006.01)
*G06T 17/00* (2006.01)

(52) U.S. Cl.
CPC ........ *G01R 29/0892* (2013.01); *G01R 29/0871* (2013.01); *G06T 17/00* (2013.01)

(58) Field of Classification Search
CPC ..... G01B 11/024; H04N 7/18; H04N 7/1851; G01C 15/00
USPC ........... 348/135, 162; 324/633, 750; 376/133; 422/186; 702/57, 132; 600/424
IPC ....................................................... G01R 29/08
See application file for complete search history.

(56) References Cited

U.S. PATENT DOCUMENTS

| 6,617,860 B2 * | 9/2003 | Uesaka et al. ................ 324/633 |
| 7,315,173 B2 | 1/2008 | Funato et al. |

(Continued)

FOREIGN PATENT DOCUMENTS

| JP | 5-119089 | 5/1993 |
| JP | 10-021407 | 1/1998 |

(Continued)

OTHER PUBLICATIONS

Abstract and English machine translation of JP 11-083920 dated Mar. 26, 1999.

(Continued)

*Primary Examiner* — Thao X Le
*Assistant Examiner* — Long Le
(74) *Attorney, Agent, or Firm* — Wenderoth, Lind & Ponack, L.L.P.

(57) ABSTRACT

A device includes an electromagnetic field sensor which detects an intensity of an electromagnetic field; and a single video camera which captures video of space in which the electromagnetic field sensor is included. A determining unit is configured to determine at least a two-dimensional location of the electromagnetic field sensor by analyzing the video captured by the video camera; and a visualizing unit is configured to visualize the space distribution of the electromagnetic field, based on the intensity of the electromagnetic field detected by the electromagnetic field sensor and the two-dimensional location determined by the determining unit.

15 Claims, 9 Drawing Sheets

(56) References Cited

U.S. PATENT DOCUMENTS

| | | | |
|---|---|---|---|
| 7,358,749 B2* | 4/2008 | Kazama et al. | 324/754.27 |
| 2004/0097805 A1* | 5/2004 | Verard et al. | 600/428 |
| 2005/0157832 A1* | 7/2005 | Nordberg | 376/133 |
| 2006/0071669 A1 | 4/2006 | Funato et al. | |
| 2007/0024293 A1* | 2/2007 | Kosaka et al. | 324/750 |
| 2007/0093983 A1* | 4/2007 | Chen et al. | 702/132 |
| 2007/0225550 A1* | 9/2007 | Gattani et al. | 600/101 |
| 2008/0027648 A1 | 1/2008 | Fujiwara et al. | |
| 2008/0233020 A1* | 9/2008 | Purta et al. | 422/186 |
| 2009/0006011 A1* | 1/2009 | Kazawa et al. | 702/57 |

FOREIGN PATENT DOCUMENTS

| | | |
|---|---|---|
| JP | 11-83920 | 3/1999 |
| JP | 2003-66079 | 3/2003 |
| JP | 2005-024439 | 1/2005 |
| JP | 2005-351710 | 12/2005 |
| JP | 2006-17631 | 1/2006 |
| JP | 2006-98158 | 4/2006 |
| JP | 2006-242672 | 9/2006 |
| JP | 2007-104584 | 4/2007 |
| JP | 2007-212241 | 8/2007 |

OTHER PUBLICATIONS

Abstract and English machine translation of JP 2006-242672 dated Sep. 14, 2006.

Abstract and English machine translation of JP 2007-212241 dated Aug. 23, 2007.

Partial English translation of Chapters 5 to 6 and Figures 4 to 6, pp. 42-43 for Ishibata et al."Localization and Visualization of Low-Frequency Electromagnetic Sources", Technical Report of IEICE, The Institute of Electronics, Information and Communication engineers, vol. 103, No. 234, Jul. 24, 2003, pp. 39-44.

International Search Report issued Dec. 2, 2008 in International (PCT) Application No. PCT/JP2008/002335.

Yoshihiko Nishi et al., "*Development of a Visualization System of Low-Frequency Electromagnetic Noise Sources*", Proceedings of the 2003 IEICE General Conference, Mar. 3, 2003, p. 412.

Kyoko Ishibana et al., "*Localization and Visualization of Low-Frequency Electromagnetic Sources*", Technical Report of IEICE, vol. 103, No. 237, MW2003-78, Jul. 24, 2003, pp. 39-44.

A Reply (First) submitted in International Application No. PCT/JP2008/002335 and its English translation.

\* cited by examiner

ELECTROMAGNETIC FIELD SPACE DISTRIBUTION VISUALIZING DEVICE, ELECTROMAGNETIC FIELD SPACE DISTRIBUTION VISUALIZING METHOD, AND PROGRAM THEREOF

BACKGROUND OF INVENTION

1. Technical Field

The present invention relates to an electromagnetic field space distribution visualizing device which visualizes a space distribution of an electromagnetic field.

2. Background Art

Much attention is drawn to a so-called EMC (Electromagnetic compatibility) problem that unnecessary electromagnetic noise generated by electronic, information, communication, and industrial devices or the like causes other electronic devices to malfunction or the like. For this, there are proposed techniques of visualizing space distributions of electromagnetic fields around devices generating electromagnetic noise (for example, refer to Patent Reference 1). Visualization of the space distribution of an electromagnetic field allows an intuitive understanding of an electromagnetic noise emission point of a device and the amount of the electromagnetic noise, thereby facilitating countermeasures against electromagnetic noise.

Figure 1:
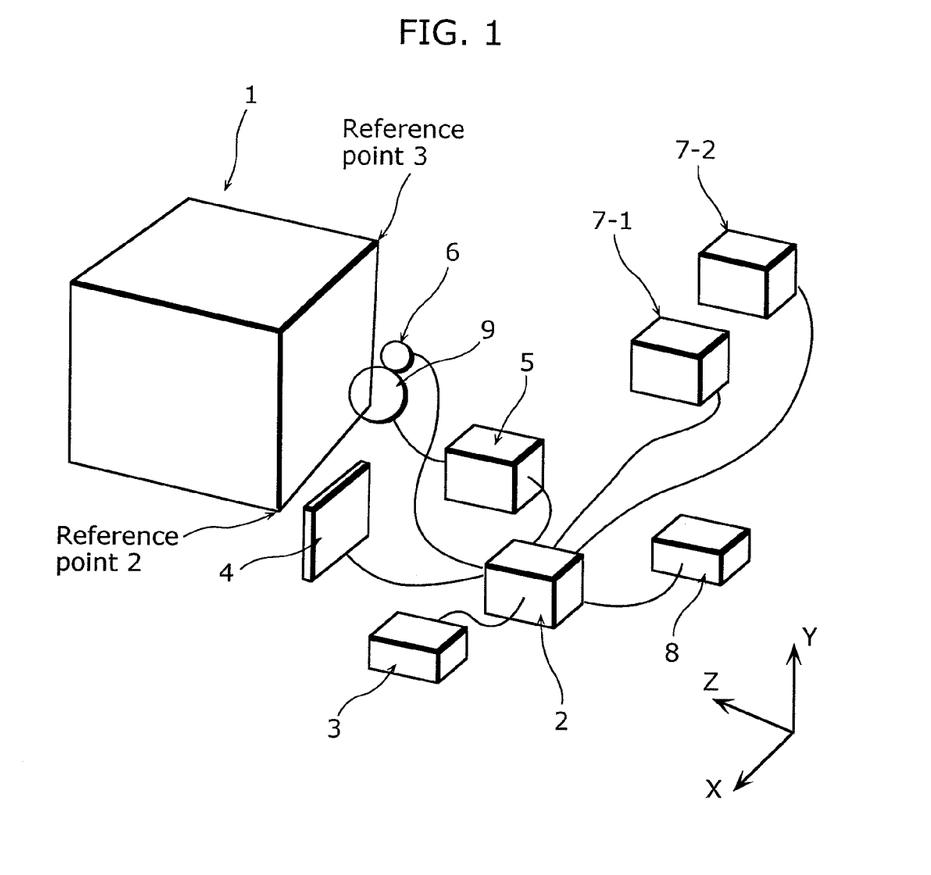
FIG. 1 is a diagram showing the overall configuration of the electromagnetic disturbing wave measuring device disclosed in Patent Reference 1.

FIG. 1 is a diagram showing the overall configuration of the electromagnetic disturbing wave measuring device disclosed in Patent Reference 1. Here is shown how to measure electromagnetic noise of a structure 1. An input device 3, a display device 4, a spectrum analyzer 5, a light emitting element 6, a camera A7-1, a camera B7-2, and a recording medium 8 are connected to a central control device 2.

The light emitting element 6 is fixed to an electromagnetic field probe 9. Electromagnetic noise is measured by aligning the electromagnetic probe 9 to a reference point 2, a reference point 3, or the like while causing the light emitting element 6 to be luminescent. A signal produced by the light emitting element 6 is detected by the two cameras A7-1 and B7-2. Based on the parallax between these two cameras A7-1 and B7-2, the location of the electromagnetic probe 9 is three-dimensionally measured.

CITATION LIST

Patent Literature

[PTL 1]
Japanese Unexamined Patent Application Publication No. 2003-66079

SUMMARY OF INVENTION

The technique disclosed in Patent Reference 1 makes it possible to visualize the space distribution of an electromagnetic field, and thus to intuitively understand an electromagnetic noise emission point of a device and the amount of the electromagnetic noise, thereby facilitating countermeasures against electromagnetic noise.

However, since the electromagnetic field probe 9 needs to be aligned to a reference point 2, a reference point 3, or the like causing the light emitting element 6 to be luminescent, it is likely that a large measuring device is required to perform space scanning of the electromagnetic field probe. In addition, since the location of the electromagnetic field prove is measured based on the parallax, at least two cameras are required.

The present invention is intended to solve the aforementioned problem, and has an object to provide a simply-configured electromagnetic field space distribution visualizing device or the like which visualizes a space distribution of an electromagnetic field.

Solution to Problem

In order to solve the aforementioned problem, an electromagnetic field space distribution visualizing device according to an aspect of the present invention is intended to visualize a space distribution of an electromagnetic field, and the device includes: an electromagnetic field sensor which detects an intensity of the electromagnetic field; a single video camera which captures video of space in which the electromagnetic field sensor is included; a determining unit configured to determine a three-dimensional location of the electromagnetic field sensor by analyzing the video captured by the video camera; and a visualizing unit configured to visualize the space distribution of the electromagnetic field, based on the intensity of the electromagnetic field detected by the electromagnetic field sensor and the three-dimensional location determined by the determining unit.

With this, it is possible to visualize the space distribution of an electromagnetic field using a simple configuration without requiring two cameras and a large sensor scanning device which are required conventionally.

It is preferable that an appearance of the electromagnetic field sensor is spherical, and that the determining unit is configured to determine the three-dimensional location, based on a location of the electromagnetic field sensor shown in the video captured by the video camera.

With this, it is possible to determine the two-dimensional location of the electromagnetic field sensor by performing a simple process of determining the location (such as the center position) of the electromagnetic field sensor shown in the video.

It is preferable that the determining unit is configured to further determine the three-dimensional location of the electromagnetic field sensor, based on an external size of the electromagnetic field sensor shown in the video captured by the video camera.

With this, it is possible to determine the three-dimensional location of the electromagnetic field sensor by performing a simple process of determining the external size of the electromagnetic field sensor shown in the video.

It is preferable that the determining unit is configured to further determine an orientation of the electromagnetic field sensor by analyzing the video captured by the video camera.

Since the orientation of the electromagnetic field sensor is determined in this way, it is possible to correctly detect the intensity and vector direction of the electromagnetic field.

It is preferable that an appearance of the electromagnetic field sensor is of a ball having a spherical surface assigned with a predetermined mark, and that the determining unit is configured to determine the orientation of the electromagnetic field sensor, based on a positional relationship between the electromagnetic field sensor and the predetermined mark shown in the video captured by the video camera.

With this, it is possible to determine the orientation of the electromagnetic field sensor by performing a simple process of determining the positional relationship between the electromagnetic field sensor and the mark shown in the video.

It is preferable that the electromagnetic field sensor includes at least two circular marks having different patterns or colors at positions in at least two directions included in XYZ directions on the spherical surface, and that the determining unit is configured to determine the orientation of the electromagnetic field sensor, based on positional relationships between the electromagnetic field sensor and the circular marks shown in the video captured by the video camera, and the patterns or colors of the circular marks.

With this, it is possible to determine the orientation of the electromagnetic field sensor by performing a simple process of determining (i) the positional relationships between the electromagnetic field sensor and the circular marks and (ii) the patterns or colors of the circular marks shown in the video.

It is preferable that the electromagnetic sensor detects the intensity of the electromagnetic field every time a predetermined time elapses, that the determining unit is configured to determine, every time the predetermined time elapses, a three-dimensional location of the electromagnetic field sensor by analyzing the video captured by the video camera, and that visualizing unit is configured to visualize, every time the predetermined time elapses, the space distribution of the electromagnetic field, based on a current intensity of the electromagnetic field detected by the electromagnetic field sensor and a current three-dimensional location of the electromagnetic field sensor determined by the determining unit. With this, it is possible to visualize the space distribution of the electromagnetic field in real time.

It is preferable that the visualizing unit is configured to display the three-dimensional location determined by the determining unit using a color corresponding to the intensity of the electromagnetic field detected by the electromagnetic field sensor.

The intensities of the electromagnetic fields are displayed with colors corresponding to the intensities in this way. Thus, it is possible to intuitively understand an electromagnetic noise emission point of a device and the amount of the electromagnetic noise, thereby facilitating countermeasures against electromagnetic noise.

It is preferable that the electromagnetic field sensor further detects an orientation of an electromagnetic field vector, and that the visualizing unit is configured to display an arrow showing the orientation of the electromagnetic field vector with respect to the three-dimensional location determined by the determining unit, the orientation of the electromagnetic field vector being detected by the electromagnetic field sensor, and the arrow having a length corresponding to the intensity of the electromagnetic field detected by the electromagnetic field sensor.

The intensities of the electromagnetic fields are displayed with arrows corresponding to the intensities in this way. Thus, it is possible to intuitively understand an electromagnetic noise emission point of a device and the amount of the electromagnetic noise, thereby facilitating countermeasures against electromagnetic noise.

It is to be noted that the present invention can be implemented not only as such electromagnetic field space distribution visualizing device, but also as an electromagnetic field space distribution visualizing method including, as the steps, the unique processes performed by the structural elements included in the electromagnetic field space distribution visualizing device and a program causing a computer to execute these steps. As a matter of course, such program can be distributed using recording media such as CD-ROMs and via communication media such as the Internet.

As clear from the above descriptions, the present invention makes it possible to visualize the space distribution of an electromagnetic field using a simple configuration without requiring two cameras and a large sensor scanning device which are required conventionally.

In other words, the electromagnetic field space distribution visualizing device according to the present invention is a compact device capable of measuring and visualizing the space distribution of an electromagnetic field in a very simple manner of moving a sensor while watching the video captured by a camera with a feeling of "painting a color on a virtual canvas in space using a sensor like a painting brush". For this, the electromagnetic field space distribution visualizing devices according to the present invention are extremely applicable in measuring electromagnetic environments in sites such as offices and factories in which large measuring devices cannot be carried.

Furthermore, the present invention can be applied to estimation of the locations and shapes of the sources of electromagnetic noise waves, and thus can provide the sites with important information for noise wave source determination and countermeasures against the noise. A completed electromagnetic field space distribution visualizing device according to the present invention makes it possible, for example, to measure and visualize the electromagnetic field space distributions and even the locations and shapes of the wave sources in addition to conventional measurement of only the noise spectra and intensities in EMC tests performed on devices, and thus the device expectedly provides a significant breakthrough in the EMC measurement method.

In addition, the present invention allows selective use of various electromagnetic field sensors depending on situations, thereby facilitating measurement and visualization of space distributions in various scenes. Furthermore, the present invention makes it possible to understand, as video, the space distributions of the electromagnetic field intensities, and thereby facilitating evaluation of fading patterns due to reflected electromagnetic waves from buildings and walls (fading relates to the space-dependent intensities of electromagnetic fields generated due to interference).

Further, the visualization of the invisible electromagnetic field space distribution has a significant meaning in terms of education and enlightenment in science and technology relating to electromagnetic fields and radio waves. Easy visualization of electromagnetic fields should allow general students in elementary, junior, and high schools and adults to be interested in and correctly understand the electromagnetic fields and radio waves, in addition to helping university students who major in electromagnetics and radio wave engineering and engineers in the same fields.

REFERENCE SIGNS LIST

10 Electromagnetic field sensor
20 Video camera
30 PC
31 Determining unit
32 Visualizing unit
40 Display
50 Microwave oven
1000 Electromagnetic field space distribution visualizing device

DETAILED DESCRIPTION OF INVENTION

An embodiment of the present invention is described in detail below with reference to the drawings.

Figure 2:
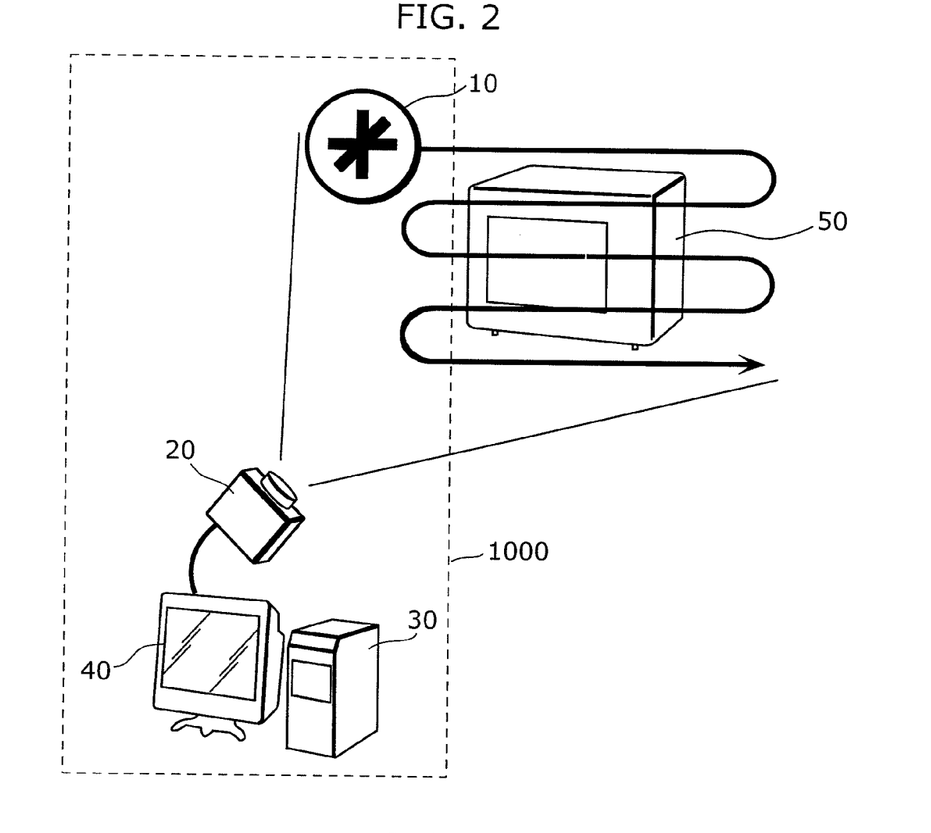
FIG. 2 is a schematic view of the electromagnetic field space distribution visualizing device according to an embodiment of the present invention.

FIG. 2 is a schematic view of an electromagnetic field space distribution visualizing device 1000 according to the embodiment of the present invention. FIG. 2 additionally shows a microwave oven 50 for illustration.

As shown in FIG. 2, the electromagnetic field space distribution visualizing device 1000 includes an electromagnetic field sensor 10, a video camera 20, a PC (Personal Computer) 30, and a display 40.

In the visualization of the space distribution of the electromagnetic field around the microwave oven 50, video of the space around the microwave oven 50 is captured using a video camera 20 first. At this time, the video is captured so as to include the electromagnetic field sensor 10.

The captured video is input into the PC 30, and is displayed on the display 40. Moving the electromagnetic field sensor 10 watching the video in this state causes the electromagnetic field space distributions on the movement trajectory to be sequentially displayed on the display 40, which is described in detail below. Specifically, it is possible to visualize the electromagnetic field space distributions with a feeling of drawing a painting on the virtual canvas in space using the electromagnetic field sensor 10.

Although the present invention is intended to visualize such electromagnetic field space distributions, the embodiment is described focusing on a case of visualizing low-frequency electromagnetic noise included in electromagnetic noise. More specifically, the targets include IH heaters (tens of kHz), inverter power sources (tens of kHz), CRT TVs (15 kHz), and electric heaters (50/60 Hz).

In the case of this low-frequency electromagnetic field, it is possible to simultaneously measure the electromagnetic field intensities in the three XYZ directions using a later-described three-axis sensor. As a matter of course, mobile phones (800 MHz to 2 GHz), wireless LANs (2.4 GHz), and the like can be targets when antennas for high-frequency electromagnetic fields are employed. In the case of this high-frequency electromagnetic field, it is possible to measure the electromagnetic field intensity in a single direction in which such antenna is oriented at the time of measurement. This sensor can be arbitrarily exchanged depending on the measurement targets.

Figure 3:
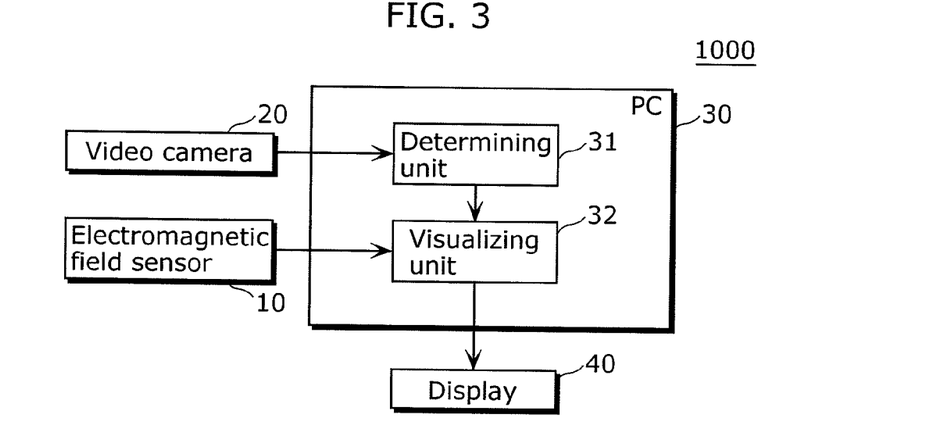
FIG. 3 is a schematic view of the electromagnetic field space distribution visualizing device according to the embodiment of the present invention.

FIG. 3 is a schematic view of an electromagnetic field space distribution visualizing device 1000 according to the embodiment of the present invention.

The electromagnetic field space distribution visualizing device 1000 includes an electromagnetic field sensor 10, a single video camera 20, a determining unit 31, a visualizing unit 32, and a display 40.

The electromagnetic field sensor 10 detects the electromagnetic field intensity, and transmits the detected electromagnetic field intensity to the visualizing unit 32 of the PC 30. The video camera 20 captures video of space in which the electromagnetic field sensor 10 is included, and transmits the captured video to the determining unit 31 of the PC 30.

The determining unit 31 determines the three-dimensional location and orientation of the electromagnetic field sensor 10 by analyzing the video captured by the video camera 20. The visualizing unit 32 visualizes the electromagnetic field space distributions based on (i) the electromagnetic field intensities detected by the electromagnetic field sensor 10 and (ii) the three-dimensional location and orientation, of the electromagnetic field sensor 10, both of which are determined by the determining unit 31.

The display 40 displays the video captured by the video camera 20 and the electromagnetic field space distributions visualized by the visualizing unit 32. Here, the visualizing unit 32 and the display 40 are configured as separate structural elements, but the display 40 may be a part of the visualizing unit 32.

Figure 4A:
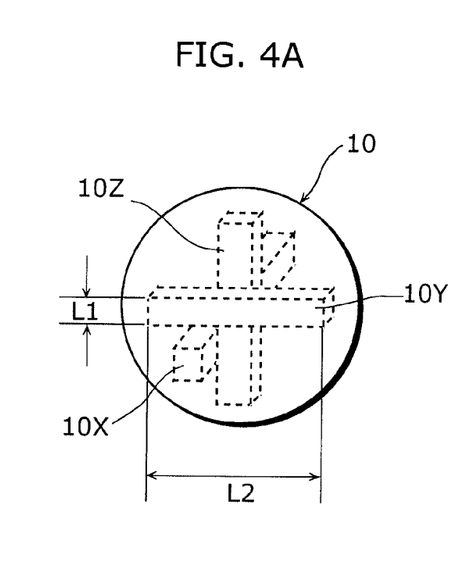
FIG. 4A is a diagram showing the internal configuration of an electromagnetic field sensor according to the embodiment of the present invention.
Figure 4B:
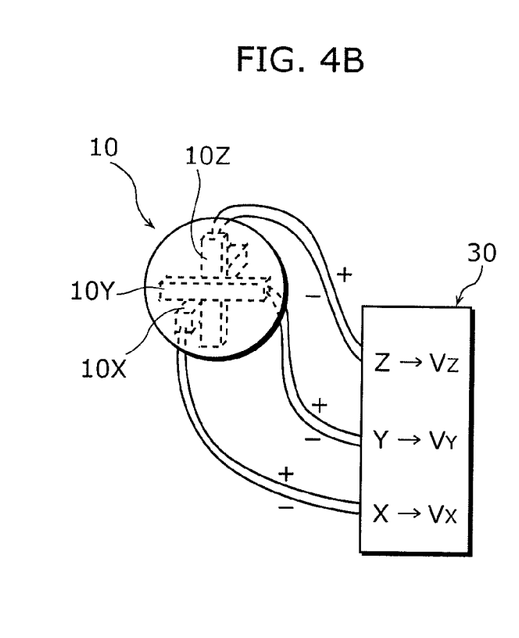
FIG. 4B is a diagram showing the internal configuration of the electromagnetic field sensor according to the embodiment of the present invention.

FIGS. 4A and 4B are diagrams showing the internal configuration of the electromagnetic field sensor 10. The electromagnetic field sensor 10 shown in FIGS. 4A and 4B is an exemplary magnetic sensor capable of measuring magnetic fields among electromagnetic field sensors. The electromagnetic field sensor 10 may include either a means capable of measuring electric fields or a means capable of measuring electric fields and magnetic fields.

As shown in FIG. 4A, the appearance of the electromagnetic field sensor 10 is spherical. This spherical casing includes search coils. The appearance of each of the search coils looks like a rectangular pole having a width L1 of approximately 1.5 cm, and a length L2 of approximately 10 cm. The respective three search coils 10X, 10Y, and 10Z are embedded in the XYZ directions orthogonal to one another.

Each search coil includes a cylindrical core with a copper wire wound therearound ten to twenty thousand times. The both ends of the copper wire are pulled out and connected to the PC 30 as shown in FIG. 4B so as to measure the voltage values Vx, Vy, and Vz. In the case where the voltage is too weak to be measured when both the ends of the copper wire are pulled out and connected to the PC 30, a not-shown amplifier may be provided between the electromagnetic field sensor 10 and the PC 30 as necessary.

The internal configuration of the exemplary electromagnetic field sensor 10 shown here is a mere example. For example, the external size can be changed, the core (a magnetic body) is not necessarily cylindrical, and the number of times of winding a copper wire can be changed depending on the sensitivity. The X, Y, and Z axes in the descriptions below correspond to the locations of the search coils 10X, 10Y, and 10Z shown in FIG. 4A, respectively.

Figure 5A:
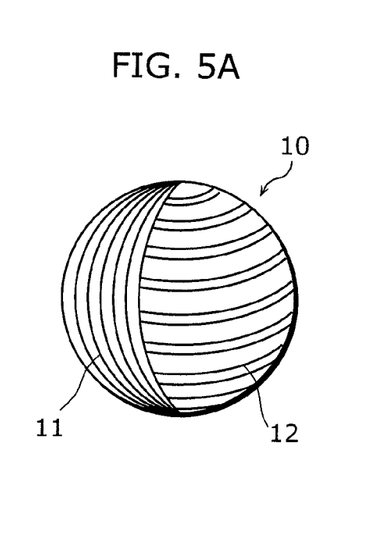
FIG. 5A is a schematic view of an electromagnetic field sensor according to the embodiment of the present invention.
Figure 5B:
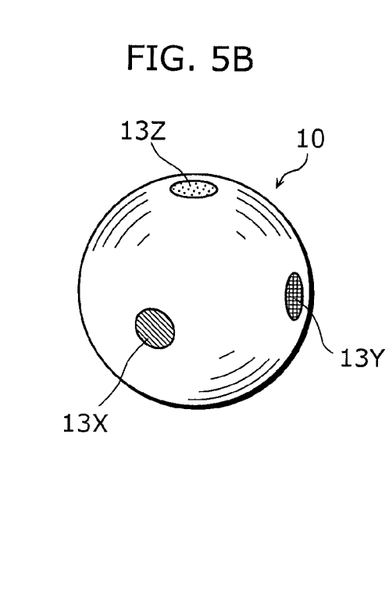
FIG. 5B is a schematic view of an electromagnetic field sensor according to the embodiment of the present invention.
Figure 5C:
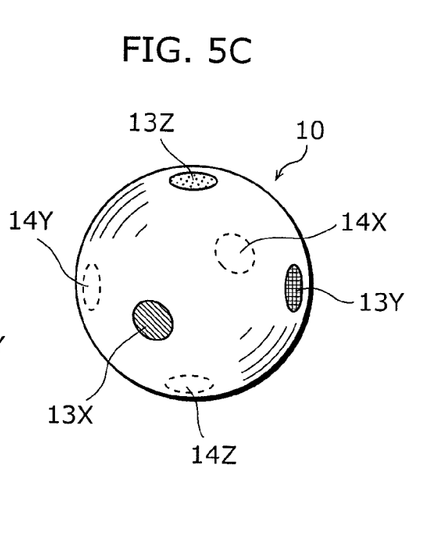
FIG. 5C is a schematic view of an electromagnetic field sensor according to the embodiment of the present invention.

FIGS. 5A, 5B, and 5C are schematic views of electromagnetic field sensors 10.

In order to correctly detect the intensities and vector directions of the electromagnetic field, there is a need to recognize the orientation of the electromagnetic field sensor 10. Since the orientation of the electromagnetic field sensor 10 is determined by analyzing the video captured by the video camera 20, predetermined marks are assigned on the spherical surface of the electromagnetic field sensor 10.

For example, as shown in FIG. 5A, the electromagnetic field sensor 10 is provided with different colors or patterns in a symmetric manner such that the left half area 11 is painted in blue and the right half area 12 is painted in red. Otherwise, as shown in FIG. 5B, the spherical surface positions in the respective XYZ directions may be provided with circular marks 13X, 13Y and 13Z respectively having different patterns or colors.

However, in the case where such circular marks 13X, 13Y and 13Z are assigned to only the spherical surface positions in the respective XYZ positive directions in this way, it is impossible to determine the orientation of the electromagnetic field sensor 10 when the back side is positioned in front of the video camera 20.

For this, as shown in FIG. 5C, it is preferable that similar circular marks 14X, 14Y, and 14Z are assigned to the spherical surface positions in the negative directions with respect to the XYZ directions. This makes it possible to correctly determine the orientation of the electromagnetic field sensor 10 irrespective of the directions. It is also possible to embed an acceleration sensor in the electromagnetic field sensor 10 and causes the acceleration sensor to detect the vertical direction.

Figure 6A:
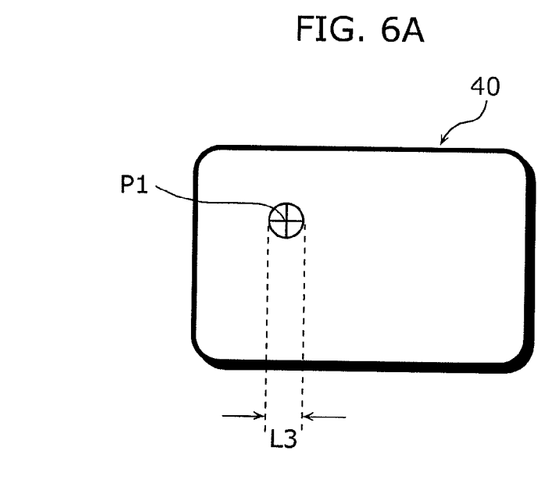
FIG. 6A is an illustration of an approach of determining the three-dimensional location of the electromagnetic field sensor according to the embodiment of the present invention.
Figure 6B:
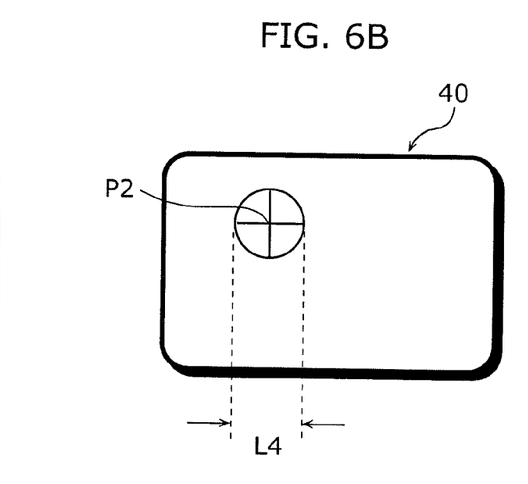
FIG. 6B is an illustration of an approach of determining the three-dimensional location of the electromagnetic field sensor according to the embodiment of the present invention.

FIGS. 6A and 6B are illustrations of an approach of determining the three-dimensional location of the electromagnetic field sensor 10.

Here, the three-dimensional location of the electromagnetic field sensor 10 means the relative three-dimensional location of the electromagnetic field sensor 10 when seen from the video camera 20. As shown in FIGS. 6A and 6B, the display 40 displays the video obtained when the video camera 20 captured video of the electromagnetic field sensor 10. In this case, a ball representing the appearance of the electromagnetic field sensor 10 is displayed in the video on the display 40. The location (for example, the center position) and size of the ball is determined by analyzing the video.

The location of the ball displayed on the display 40 shows the two-dimensional location of the electromagnetic field sensor 10, and the size of the ball shows the depth (distance) from the video camera 20 to the electromagnetic field sensor 10. Since two-dimensional coordinates are displayed in the video as a matter of course, the locations of the balls are represented as the positions P1 and P2 on the circles in the video, and the sizes of the balls are represented as sizes L3 and L4 in the video.

Here, the ball's size L3 shown in FIG. 6A is smaller than the ball's size L4 shown in FIG. 6B. This shows that the electromagnetic field sensor 10 in FIG. 6B is closer to the video camera 20 than the electromagnetic field sensor 10 in FIG. 6A is. The use of the ball-shaped electromagnetic field sensor 10 makes it possible to determine the three-dimensional location of the electromagnetic field sensor 10 in a simple manner irrespective of the orientation of the electromagnetic field sensor 10.

Figure 7A:
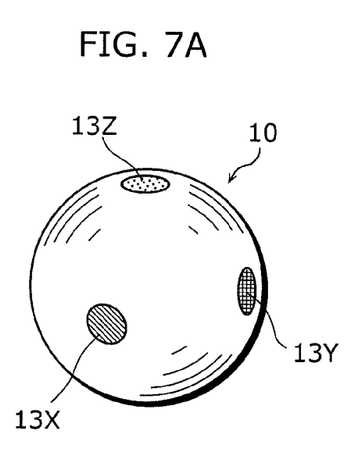
FIG. 7A is an illustration of an approach of determining the orientation of the electromagnetic field sensor according to the embodiment of the present invention.
Figure 7B:
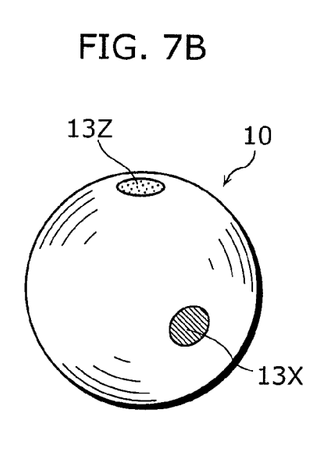
FIG. 7B is an illustration of an approach of determining the orientation of the electromagnetic field sensor according to the embodiment of the present invention.
Figure 7C:
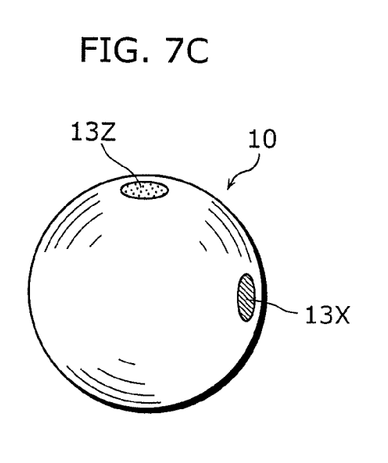
FIG. 7C is an illustration of an approach of determining the orientation of the electromagnetic field sensor according to the embodiment of the present invention.

FIGS. 7A, 7B, and 7C are illustrations of an approach of determining the orientation of the electromagnetic field sensor 10.

First, the orientation of the electromagnetic field sensor 10 means the relative orientation of the electromagnetic field sensor 10 when seen from the video camera 20. Here, as shown in FIG. 5B, a description is given taking an exemplary electromagnetic field sensor 10 assigned with the three circular marks 13X, 13Y, and 13Z.

As shown in FIG. 7A, at the initial state, the three circular marks 13X, 13Y, and 13Z can be recognized. When the electromagnetic field sensor 10 is rotated about the Z axis that is the rotation axis counterclockwise (to the left) by 45 degrees in the initial state, the circular mark 13X approaches the Y axis and the circular mark 13Y disappears to the back side as shown in FIG. 7B.

When the electromagnetic field sensor 10 is further rotated about the Z axis that is the rotation axis counterclockwise (to the left) by another 45 degrees, the circular mark 13X is positioned on the Y axis as shown in FIG. 7C. Here, the position of the circular mark 13Z does not change because the electromagnetic field sensor is rotated about the Z axis as the rotation axis.

In this way, predetermined marks assigned to the electromagnetic field sensor 10 make it possible to determine the orientation of the electromagnetic field sensor 10 by analyzing the captured video. Here, since circular marks respectively having different patterns or colors are assigned to the respective spherical surface positions in the XYZ directions, it is possible to determine the orientation of the electromagnetic field sensor 10 based on (i) the positional relationships with the ball (the appearance of the electromagnetic field sensor 10) and the circles and (ii) the patterns and colors of the circles, both of which are shown in the captured video.

As shown in FIG. 5A, there is a case where the electromagnetic field sensor 10 is provided with different colors or patterns in a symmetric manner such that the left half area 11 is painted in blue and the right half area 12 is painted in red. In this case, it is possible to determine the orientation of the electromagnetic field sensor 10 based on the dimensional ratio between a blue area and a red area included in the ball.

However, although the method based on such dimensional ratio allows determination of a tilt of the electromagnetic field sensor 10 in a horizontal direction, it does not allow determination of a tilt in the vertical direction. Accordingly, in the case where a tilt of the electromagnetic field sensor 10 in the vertical direction needs to be determined, for example, another method of recognizing tilts of patterns assigned symmetrically is to be concurrently used.

Figure 8A:
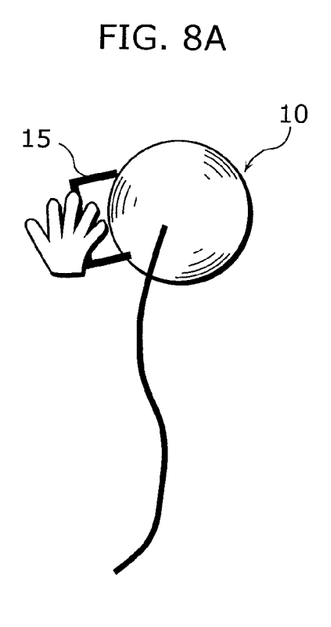
FIG. 8A is an illustration of a method of operating the electromagnetic field sensor according to the embodiment of the present invention.
Figure 8B:
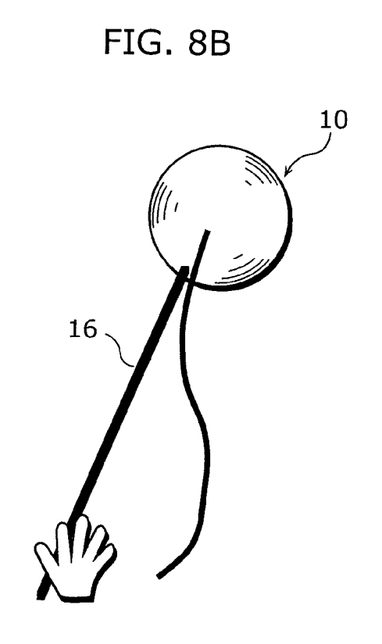
FIG. 8B is an illustration of a method of operating the electromagnetic field sensor according to the embodiment of the present invention.

FIGS. 8A and 8B are illustrations of a method of operating the electromagnetic field sensor 10.

Since the appearance of the electromagnetic field sensor 10 is spherical as described earlier, there is a need to attach a gadget that is easily held by hand when the electromagnetic field sensor 10 is operated.

For this, in the case where a low-frequency electromagnetic noise is the target, in other words, when a three-dimensional sensor is employed, the spherical electromagnetic field sensor 10 is provided with a holder 15 as shown in FIG. 8A. The use of this holder 15 makes it possible to easily move the electromagnetic field sensor 10 to a desired location.

In contrast, in the case where a high-frequency electromagnetic noise is the target, in other words, when an antenna for high-frequency electromagnetic fields is employed, a pole 16 protruded from the spherical electromagnetic field sensor 10 is held as shown in FIG. 8B. This pole 16 is employed with an aim to keep off the user's hand from the antenna for high-frequency electromagnetic fields to the position at which the user's hand does not affect measurement results because the measurement results are affected by the user's hand if the user's hand is too close to the antenna for high-frequency electromagnetic fields.

Figure 9:
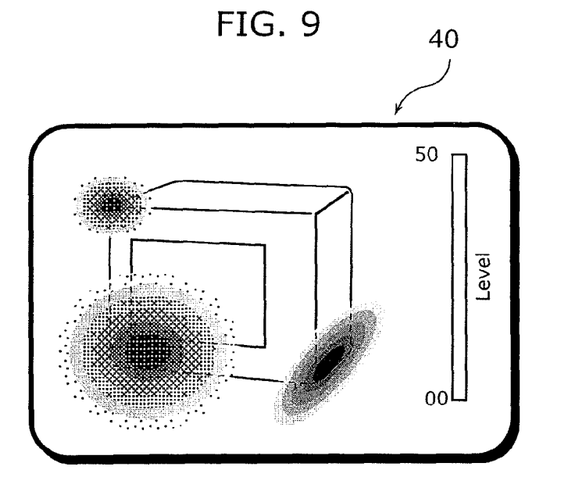
FIG. 9 is a diagram showing an exemplary visualization according to the embodiment of the present invention.

FIG. 9 is a diagram showing an exemplary visualization according to the embodiment of the present invention.

As already described, "the location in the video" of the electromagnetic field sensor 10 captured in the video is to be recognized and displayed on the display 40 in such a manner that electromagnetic field data is superimposed at the location. At this time, in the case where high-frequency electromagnetic noise is the target, only the electromagnetic field in the single direction in which the antenna is oriented at the time of measurement is displayed with color.

In contrast, in the case where low-frequency electromagnetic noise is the target, electromagnetic field intensities in the three XYZ directions (or the electromagnetic field intensity in one of these components) may be displayed with colors, or the sizes of the three-dimensional vectors may be displayed with colors.

As shown in FIG. 9, video of the microwave oven 50 and the space distribution of the electromagnetic field therearound captured by the video camera 20 are displayed on the display 40. As shown by the arrow in FIG. 2, it is assumed here that the electromagnetic field sensor 10 is moved meanderingly in front of the microwave oven 50 from the upper left to the lower right.

In this case, colors corresponding to the intensities of the electromagnetic field are sequentially displayed on the display 40 from the upper left to the lower right in a meandering manner. Here, the upper and lower left portions of the front surface and the lower portion of the right side surface of the microwave oven 50 are displayed with dark colors, showing that the electromagnetic intensities at the three portions are great.

Here, the present invention visualizes the space distributions of the electromagnetic field in real time. For example, when it is possible to display a current picture on the display 40 30 times per 1 second, that is, at a frame rate of 30 fps, the electromagnetic field intensities (voltage values Vx, Vy, Vz) are detected for each 1/30 second, and the three-dimensional location of the electromagnetic field sensor 10 is determined for each 1/30 second. Subsequently, the three-dimensional location determined in this way is displayed with a color overwritten corresponding to the electromagnetic intensity at each current time. In this way, it is possible to visualize the electromagnetic field space distributions with a feeling of drawing a painting on the virtual canvas in space using the electromagnetic field sensor 10.

Figure 10:
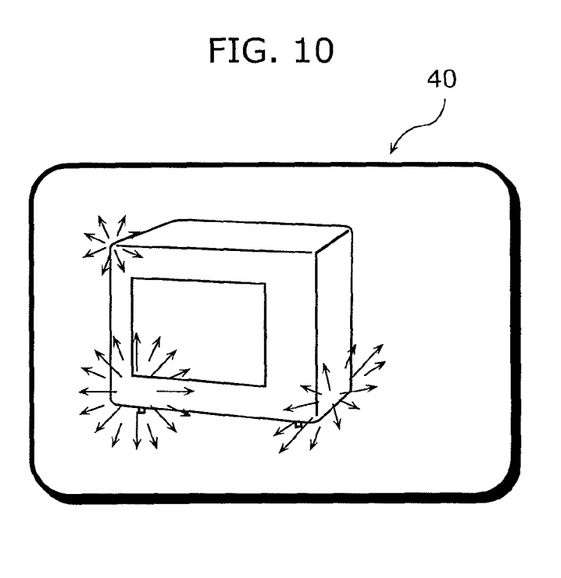
FIG. 10 is a diagram showing another exemplary visualization according to the embodiment of the present invention.

FIG. 10 is a diagram showing another exemplary visualization according to the embodiment of the present invention.

As shown in FIG. 10, the electromagnetic field vectors may be visualized using arrows. In other words, the use of the electromagnetic field sensor 10 capable of detecting even electromagnetic field vectors makes it possible to display arrows showing the orientations of the electromagnetic field vectors with respect to the three-dimensional locations of the electromagnetic field sensor 10. Preferably, the lengths of these arrows correspond to the intensities of the electromagnetic fields.

As in the case of FIG. 9, it is assumed here that the electromagnetic field sensor 10 is moved meanderingly in front of the microwave oven 50 from the upper left to the lower right. In this case, as shown in FIG. 10, plural arrows are displayed radially from the three portions that are the upper and lower left portions on the front surface and the lower portion on the right side surface of the microwave oven 50.

Figure 11:
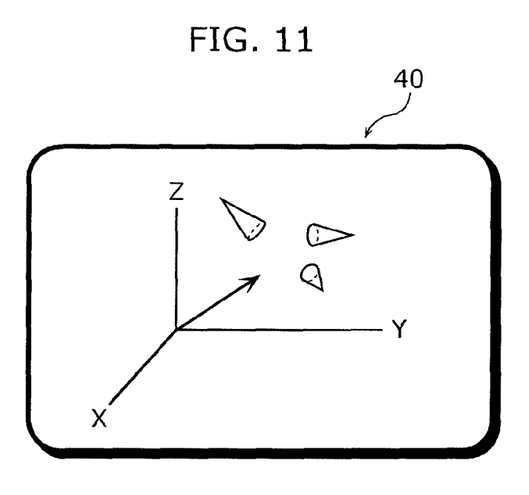
FIG. 11 is a diagram showing another exemplary visualization according to the embodiment of the present invention.

FIG. 11 is a diagram showing another exemplary visualization according to the embodiment of the present invention.

In the case where the location of the electromagnetic field sensor 10 is determined in a three-dimensional space, it is preferable that the arrows and the like showing the orientations of the electromagnetic field vectors are also displayed in a three-dimensional space. For this, as shown in FIG. 11, it is also good that the virtual XYZ axes are displayed and arrows are displayed on the three-dimensional space. At this time, in the case where high-frequency electromagnetic noise is the target, only the arrow showing the single direction in which the antenna is oriented at the time of measurement is displayed.

In contrast, in the case where low-frequency electromagnetic noise is the target, arrows showing the three XYZ directions (or an arrow showing one of these directions) are displayed. In the case where video of the actual microwave oven 50 or the like is superimposed and displayed on the virtual three-dimensional space, a matching alignment of the virtual space and the real space is performed as a matter of course.

Otherwise, as shown in FIG. 11, the orientation of the electromagnetic field vector may be shown using cones instead of arrows. In this case, each of the cones having a bottom surface center corresponding to the three-dimensional location of the electromagnetic field sensor 10 is displayed to show the direction in which the electromagnetic field vector is oriented. Preferably, the height of this cone corresponds to the intensity of the electromagnetic field. In this way, three-dimensional display of an arrow or a cone makes it possible to help intuitive understanding of the orientation of an electromagnetic field vector.

Figure 12:
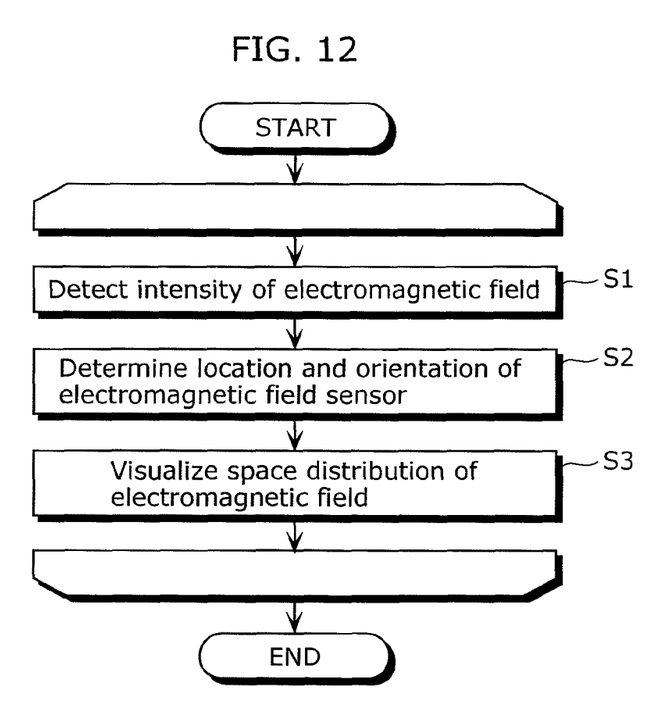
FIG. 12 is a diagram indicating operations performed by the electromagnetic field space distribution visualizing device according to an embodiment of the present invention.

FIG. 12 is a diagram indicating operations performed by the electromagnetic field space distribution visualizing device according to an embodiment of the present invention. With reference to FIG. 12, a description is given of the operations performed in the case where the space distributions of the electromagnetic fields around the microwave oven 50 are visualized.

First, video of space around the microwave oven 50 is captured by the video camera 20. At this time, video of the electromagnetic field sensor 10 is captured altogether, and the captured video is transmitted to the determining unit 31 of the PC 30. When the electromagnetic field sensor 10 is operated in this state, the intensity of each electromagnetic field is detected for each 1/30 second, and the detected values are transmitted to the visualizing unit 32 (S1).

Thereby, the determining unit 31 determines the three-dimensional location and orientation of the electromagnetic field sensor 10 for each 1/30 second (S2), and passes the determined values to the visualizing unit 32. Whereas, the visualizing unit 32 visualizes the space distributions of the electromagnetic fields, based on (i) the three-dimensional locations and orientations, of the electromagnetic field sensor 10 and (ii) the detected electromagnetic intensities, both of which are received from the determining unit 31 (S3).

The processes from Steps S1 to S3 are repeated for each 1/30 second. While a user moves the electromagnetic field sensor 10 watching the video in this way, the electromagnetic field space distributions on the movement trajectory are sequentially displayed on the display 40.

As clear from the above descriptions, the present invention makes it possible to visualize the space distribution of an electromagnetic field using a simple configuration without requiring two cameras and a large sensor scanning device which are required conventionally.

In other words, the electromagnetic field space distribution visualizing device according to the present invention is a compact device capable of measuring and visualizing the space distribution of an electromagnetic field in a very simple manner of moving a sensor while watching video captured by a camera with a feeling of "painting color on a virtual canvas in space using a sensor like a painting brush". For this, the electromagnetic field space distribution visualizing devices are extremely applicable in measuring electromagnetic environments in sites such as offices and factories in which large measuring devices cannot be carried.

Furthermore, the present invention can be applied to estimation of the locations and shapes of the sources of electromagnetic noise waves, and thus can provide the sites with important information for noise wave source determination and countermeasures against the noise. A completed electromagnetic field space distribution visualizing device according to the present invention makes it possible, for example, to measure and visualize the electromagnetic field space distributions and even the locations and shapes of the wave sources in addition to conventional measurements of only the noise spectra and intensities in EMC tests performed on devices, and thus the device expectedly provides a significant breakthrough in the EMC measurement method.

In addition, the present invention allows selective use of various electromagnetic field sensors depending on situations, thereby facilitating measurement and visualization of space distributions in various scenes. Furthermore, the present invention makes it possible to understand, as video, the space distributions of the electromagnetic field intensities, and thereby facilitating evaluation of fading patterns due to reflected electromagnetic waves from buildings or walls (fading relates to the spatial intensities of electromagnetic fields generated due to interference).

Further, the visualization of the invisible electromagnetic field space distributions has a significant meaning in terms of education and enlightenment in science and technology relating to electromagnetic fields and radio waves. Easy visualization of electromagnetic fields should allow general students in elementary, junior, and high schools and adults to be interested in and correctly understand the electromagnetic fields and radio waves, in addition to helping university students who major electromagnetics and radio wave engineering and engineers in the same fields.

In the above descriptions, the determining unit 31 determines the three-dimensional location and orientation of the electromagnetic field sensor 10 by analyzing the video captured by the video camera 20. However, determination approaches are not limited to this, and it is also possible to determine the three-dimensional location and orientation of the electromagnetic field sensor 10 by performing stereo video capturing using two video cameras, or by using a reference magnetic field generating device disposed in proximity of the camera. Such determination approaches themselves are known in public, and thus detailed descriptions are not provided here.

In addition, in the above descriptions, the three-dimensional location and orientation of the electromagnetic field sensor 10 are determined. However, the present invention is not limited to this. More specifically, it is only necessary that at least the two-dimensional location of the electromagnetic field sensor 10 is determined.

In addition, in the above descriptions, the space distributions of the electromagnetic field are visualized. However, according to the present invention, it is also possible to visualize invisible vector amounts (for example, wind). In the case of visualizing wind, the velocity and orientation of the wind are detected instead of detecting the intensity and orientation of an electromagnetic field. The other points are the same as in the case of the electromagnetic field.

In addition, it is also good to attach an LED to the electromagnetic field sensor 10. That this LED repeatedly flashes in a particular pattern in synchronization with the video signal makes it possible to easily determine the location of the electromagnetic field sensor 10 by analyzing the video captured by the video camera 20.

Further, mounting plural LEDs at several positions on the electromagnetic field sensor 10 and causing them to flash in temporally different patterns makes it possible to determine the orientation, not only the location, of the electromagnetic field sensor 10 by determining the positions of the respective LEDs in the video.

In addition, it is possible to input a measured electromagnetic field as waveform data into the PC 30 using A/D conversion although this is not particularly mentioned in the earlier descriptions. Based on the data, the waveform amplitudes and the electromagnetic field vector orientations are calculated and then visualized. In addition, it is also possible to extract and visualize only the electromagnetic field of a particular frequency component by performing a spectrum analysis such as Fourier transform on the waveform.

In addition, the above descriptions have been given of taking, as examples, the low-frequency electromagnetic field sensor and the antennas for high-frequency electromagnetic fields, but the kinds of the electromagnetic field sensors 10 are not limited to this. More specifically, any other kinds of electromagnetic field sensors 10 capable of detecting electromagnetic field intensities can be employed.

In addition, the above-descriptions relate to an exemplary case of visualizing electromagnetic noise, but the targets to be visualized according the present invention are not limited to noise. More specifically, according to the present invention, it is also possible to visualize non-noise electromagnetic waves for communication such as radio waves from mobile phones and wireless LANs. Visualization of space distributions of such electromagnetic waves for communication like these makes it easier to recognize the radiation characteristics of radio waves from mobile phones or the like. This is significantly useful in the development of mobile phones.

The embodiment disclosed this time should be interpreted as a mere example in all respects and as not being limited. The scope of the present invention is indicated by not the above descriptions but the scope of the Claims, and thus the present invention is intended to include all modifications having the meaning and scope equivalent to those of the Claims.

INDUSTRIAL APPLICABILITY

The present invention is applicable to electromagnetic environment measuring devices and the like which need to be simply configured and be capable of visualizing space distributions of electromagnetic fields.

The invention claimed is:
1. An electromagnetic field space distribution visualizing device which visualizes a space distribution of an electromagnetic field, the device comprising:
   an electromagnetic field sensor which detects an intensity of the electromagnetic field;
   a single video camera which captures video of space in which the electromagnetic field sensor is moving;
   a determining unit configured to analyze the video captured by the video camera, specify a location of the electromagnetic field sensor in the video, and determine a relative three-dimensional location of the electromagnetic field sensor, based on the location of the electromagnetic field sensor in the video, the relative three-dimensional location of the electromagnetic field sensor being a location viewed from the video camera; and
   a visualizing unit configured to determine the space distribution of the electromagnetic field by associating (i) the intensity of the electromagnetic field detected by the electromagnetic field sensor at a time point in the video and (ii) the three-dimensional location determined by the determining unit at the time point, and display the determined space distribution of the electromagnetic field.

2. The electromagnetic field space distribution visualizing device according to claim 1,
   wherein an appearance of the electromagnetic field sensor is spherical, and
   the determining unit is configured to determine the three-dimensional location, based on a location of the electromagnetic field sensor shown in the video captured by the video camera.

3. The electromagnetic field space distribution visualizing device according to claim 2,
   wherein the determining unit is configured to further determine the three-dimensional location of the electromagnetic field sensor, based on an external size of the electromagnetic field sensor shown in the video captured by the video camera.

4. The electromagnetic field space distribution visualizing device according to claim 1,
   wherein the determining unit is configured to further determine an orientation of the electromagnetic field sensor by analyzing the video captured by the video camera.

5. The electromagnetic field space distribution visualizing device according to claim 4,
   wherein an appearance of the electromagnetic field sensor is of a ball having a spherical surface assigned with a predetermined mark, and
   the determining unit is configured to determine the orientation of the electromagnetic field sensor, based on a positional relationship between the electromagnetic field sensor and the predetermined mark shown in the video captured by the video camera.

6. The electromagnetic field space distribution visualizing device according to claim 5,
   wherein the electromagnetic field sensor includes at least two circular marks having different patterns or colors at positions in at least two directions included in XYZ directions on the spherical surface, and
   the determining unit is configured to determine the orientation of the electromagnetic field sensor, based on positional relationships between the electromagnetic field sensor and the circular marks shown in the video captured by the video camera, and the patterns or colors of the circular marks.

7. The electromagnetic field space distribution visualizing device according to claim 1,
   wherein the electromagnetic sensor detects the intensity of the electromagnetic field every time a predetermined time elapses,
   the determining unit is configured to determine, every time the predetermined time elapses, a three-dimensional location of the electromagnetic field sensor by analyzing the video captured by the video camera, and
   the visualizing unit is configured to visualize, every time the predetermined time elapses, the space distribution of the electromagnetic field, based on a current intensity of the electromagnetic field detected by the electromagnetic field sensor and a current three-dimensional location of the electromagnetic field sensor determined by the determining unit.

8. The electromagnetic field space distribution visualizing device according to claim 7,
   wherein the visualizing unit is configured to display the three-dimensional location determined by the determining unit using a color corresponding to the intensity of the electromagnetic field detected by the electromagnetic field sensor.

9. The electromagnetic field space distribution visualizing device according to claim 7,
   wherein the electromagnetic field sensor further detects an orientation of an electromagnetic field vector, and
   the visualizing unit is configured to display an arrow showing the orientation of the electromagnetic field vector with respect to the three-dimensional location determined by the determining unit, the orientation of the electromagnetic field vector being detected by the electromagnetic field sensor, and the arrow having a length corresponding to the intensity of the electromagnetic field detected by the electromagnetic field sensor.

10. An electromagnetic field space distribution visualizing method of visualizing a space distribution of an electromagnetic field, the method comprising:
    detecting an intensity of the electromagnetic field, using an electromagnetic field sensor;
    capturing video of space in which the electromagnetic field sensor is moving, using a single video camera;
    analyzing the video captured by the video camera, specify a location of the electromagnetic field sensor in the video, and determining a relative three-dimensional location of the electromagnetic field sensor, based on the location of the electromagnetic field sensor in the video, the relative three-dimensional location of the electromagnetic field sensor being a location viewed from the video camera; and
    determining the space distribution of the electromagnetic field by associating (i) the intensity of the electromagnetic field detected at a time point in the video and (ii) the three-dimensional location determined at the time point, and displaying the determined space distribution of the electromagnetic field.

11. A non-transitory computer-readable recording medium storing a program for visualizing a space distribution of an electromagnetic field, the program causing a computer to execute steps comprising:
    detecting an intensity of the electromagnetic field, using an electromagnetic field sensor;
    capturing video of space in which the electromagnetic field sensor is moving, using a single video camera;

analyzing the video captured by the video camera, specify a location of the electromagnetic field sensor in the video, and determining a relative three-dimensional location of the electromagnetic field sensor, based on the location of the electromagnetic field sensor in the video, the relative three-dimensional location of the electromagnetic field sensor being a location viewed from the video camera; and determining the space distribution of the electromagnetic field by associating (i) the intensity of the electromagnetic field detected at a time point in the video and (ii) the three-dimensional location determined at the time point, and displaying the determined space distribution of the electromagnetic field.

12. An electromagnetic field space distribution visualizing device which visualizes a space distribution of an electromagnetic field, the device comprising:

an electromagnetic field sensor which detects an intensity of the electromagnetic field every time a predetermined time elapses;

a single video camera which captures video of space in which the electromagnetic field sensor is moving;

a determining unit configured to analyze the video captured by the video camera, specify a location of the electromagnetic field sensor in the video, and determine, every time the predetermined time elapses, a relative three-dimensional location of the electromagnetic field sensor, based on the location of the electromagnetic field sensor in the video, the relative three-dimensional location of the electromagnetic field sensor being a location viewed from the video camera; and a visualizing unit configured to determine, every time the predetermined time elapses, the space distribution of the electromagnetic field by associating (i) the intensity of the electromagnetic field detected by the electromagnetic field sensor at a time point in the video and (ii) the three-dimensional location determined by the determining unit at the time point, and display the determined space distribution of the electromagnetic field.

13. An electromagnetic field space distribution visualizing method of visualizing a space distribution of an electromagnetic field, the method comprising:

detecting an intensity of the electromagnetic field every time a predetermined time elapses, using an electromagnetic field sensor;

capturing video of space in which the electromagnetic field sensor is moving, using a single video camera;

analyzing the video captured by the video camera, specify a location of the electromagnetic field sensor in the video, and determining, every time the predetermined time elapses, at least a relative two-dimensional location of the electromagnetic field sensor, based on the location of the electromagnetic field sensor in the video, the relative two-dimensional location of the electromagnetic field sensor being a location viewed from the video camera; and determining, every time the predetermined time elapses, the space distribution of the electromagnetic field by associating (i) a current intensity of the electromagnetic field detected at a time point in the video and (ii) a current two-dimensional location of the electromagnetic field sensor determined at the time point, and displaying the determined space distribution of the electromagnetic field.

14. A non-transitory computer-readable recording medium storing a program for visualizing a space distribution of an electromagnetic field, the program causing a computer to execute steps comprising:

detecting an intensity of the electromagnetic field every time a predetermined time elapses, using an electromagnetic field sensor;

capturing video of space in which the electromagnetic field sensor is moving, using a single video camera;

analyzing the video captured by the video camera, specifying a location of the electromagnetic field sensor in the video, and determining, every time the predetermined time elapses, at least a relative two-dimensional location of the electromagnetic field sensor, based on the location of the electromagnetic field sensor in the video, the relative two-dimensional location of the electromagnetic field sensor being a location viewed from the video camera; and determining, every time the predetermined time elapses, the space distribution of the electromagnetic field by associating (i) a current intensity of the electromagnetic field detected at a time point in the video and (ii) a current two-dimensional location of the electromagnetic field sensor determined at the time point, and displaying the determined space distribution of the electromagnetic field.

15. The electromagnetic field space distribution visualizing device according to claim 1, wherein the location of the electromagnetic field sensor in the video is based on characteristics of the electromagnetic field sensor detected in the video.

* * * * *